US007087523B2

(12) United States Patent
Grigoropoulos et al.

(10) Patent No.: US 7,087,523 B2
(45) Date of Patent: Aug. 8, 2006

(54) METHOD FOR PRODUCING A STRUCTURE USING NANOPARTICLES

(75) Inventors: Constantine P. Grigoropoulos, Berkeley, CA (US); Nicole Renée Bieri, Zurich (CH); Dimos Poulikakos, Zollikon (CH); Jaewon Chung, Albany, CA (US)

(73) Assignee: The Regents of the University of California, Oakland, CA (US)

( * ) Notice: Subject to any disclaimer, the term of this patent is extended or adjusted under 35 U.S.C. 154(b) by 90 days.

(21) Appl. No.: 10/621,046

(22) Filed: Jul. 16, 2003

(65) Prior Publication Data
US 2004/0137710 A1 Jul. 15, 2004

(51) Int. Cl.
*H01L 21/44* (2006.01)
(52) U.S. Cl. ............... 438/662; 438/962; 257/E21.582
(58) Field of Classification Search ............... 438/622, 438/660, 662, 669, 674, 679, 962
See application file for complete search history.

(56) References Cited

U.S. PATENT DOCUMENTS

| | | | | |
|---|---|---|---|---|
| 4,910,118 | A | 3/1990 | Adair et al. | 430/138 |
| 5,391,841 | A | 2/1995 | Quick | 174/258 |
| 6,331,056 | B1 | 12/2001 | Nohr et al. | 347/102 |
| 2002/0081397 | A1* | 6/2002 | McGill et al. | 427/596 |
| 2003/0047816 | A1* | 3/2003 | Dutta | 257/788 |

FOREIGN PATENT DOCUMENTS

| | | |
|---|---|---|
| EP | 0 417 294 | 3/1991 |
| JP | 11-350107 | 12/1999 |
| JP | 2000-104101 | 4/2000 |
| WO | WO 99/53738 | 10/1999 |
| WO | WO 00/10197 | 2/2000 |

OTHER PUBLICATIONS

N.R. Bieri et al, "Microstructuring by printing and laser curing of nanoparticle solutions", Applied Physics Letters, vol. 82, No. 20, May 19, 2003, pp. 3529-3531.
N.R. Bieri et al, "Manufacturing of Electrically Conductive Microstructures by Dropwise Printing and Laser Curing of Nanoparticle-Suspensions", Proceedings of IMECE2002, ASME International Mechanical Engineering Congress & Exposition, (° 2002 ASME) , Nov. 17-22, 2002, New Orleans, Louisiana, pp. 1-8.

(Continued)

*Primary Examiner*—Chandra Chaudhari
(74) *Attorney, Agent, or Firm*—Michaelson & Associates; Peter L. Michaelson; George Wolken, Jr.

(57) ABSTRACT

For forming a fine structure of a desired material, nanoparticles of the same material are prepared in a suspension. A layer of the suspension is applied by a drop-on-demand printing system to a substrate. At least part of the layer is exposed to laser light for melting the nanoparticles at least partially. Upon solidification, the molten particles are sintered together to form the desired structure. Due to the low melting point of nanoparticles as compared to the melting point of bulk material, this procedure avoids damage to the substrate and provides a better control over the structure generation process. It can be used for generating metallic and non-metallic structures on various substrates. The laser light may have non-Gaussian intensity distribution or can combine multiple beams of Gaussian and non-Gaussian distribution for improving the quality of the generated structure, or it may be pulsed for improved control of the heat flow into the substrate.

30 Claims, 4 Drawing Sheets

A) Example of a capacitor

B) Example of intersection of lines

*Polystyrene that is jettable can, for example, be used with good properties.

OTHER PUBLICATIONS

D.B. Bogy et al, "Experimental and Theoretical Study of Wave Propagation Phenomena in Drop-on-Demand Ink Jet Devices", IBM J. Rcs. Develop., vol. 28, No. 3, May 1984, pp. 314-321.

Ph. Buffat et al, "Size effect on the melting temperature of gold particles", Physical Review A, vol. 13, No. 6, Jun. 1976, pp. 2287-2298.

J.F. Dijksman, "Hydrodynamics of small tubular pumps", J. Fluid Mech. (1984), vol. 139, pp. 173-191.

Sawyer Fuller et al, "Ink Jet Fabricated Nanoparticle Mems", Proceedings IEEE 13th Annual International Conference of Micro Electro Mechanical Systems IEEE 2000, Picataway, NJ (° 2000 IEEE), pp. 138-141.

Sawyer B. Fuller et al, "Ink-Jet Printed Nanoparticle Microelectromechanical Systems", Journal of Microelectromechanical Systems, vol. 11, No. 1, Feb. 2002 (° 2002 IEEE), pp. 54-60.

G.V. Shivashankar et al, "Biomolecular recognition using submicron laser lithography", Applied Physics Letters, vol. 73, No. 3, Jul. 20, 1998 (° 1998 American Institute of Physics), pp. 417-427.

John B. Szczech et al, "Fine-Line Conductor Manufacturing Using Drop-On-Demand PZT Printing Technology", IEEE Transactions on Electronics Packaging Manufacturing, vol. 25, No. 1, Jan. 2002 (° IEEE), pp. 26 33.

\* cited by examiner

A) Example of a capacitor

B) Example of intersection of lines

*Polystyrene that is jettable can, for example, be used with good properties.

METHOD FOR PRODUCING A STRUCTURE USING NANOPARTICLES

BACKGROUND OF THE INVENTION

The present invention relates to a method for producing a structure by applying nanoparticles in a suspension onto a substrate and curing with laser radiation, and to the structures thereby produced.

The term "nanoparticles" designates particles having a diameter well in the submicron range. It has been known that such particles exhibit thermophysical properties substantially different from those of the bulk materials. In particular, the melting point typically decreases substantially for particles having diameters below approximately 100 nm (nm=nanometer), and in particular below approximately 10 nm. For example, nanoparticles of gold show a melting point of approximately 300 to 400° C. at a diameter of approximately 2.5 nm while the bulk melting point of gold is 1063° C.

In WO 00/10197 this effect is exploited for producing copper structures on a semiconductor wafer at low temperatures. A suspension of copper nanoparticles in a liquid is applied to a semiconductor chip. After evaporation of the solvent, nanoparticles are concentrated in recesses in the wafer surface and the wafer is heated above the particles' melting point to sinter or melt them. This method takes advantage of the comparatively low melting point of the particles, but it requires the presence of suitable recesses in the surface of the substrate.

Published Japanese patent application JP 2000 014 101 describes a method for forming structures by focussing a laser beam into a storage tank containing a suspension of superfine particles. This method requires a large amount of the suspension and is therefore expensive.

Szezech et al in IEEE Transactions on electronics Packaging Manufacturing, Vol. 25, No. 1, pp. 26–33 have constructed fine conductor lines by drop-on-demand jet printing of nanoparticle suspended solution followed by evaporation and sintering process in an oven maintained at moderate temperature (300° C.).

However, a need exists in the art for simple and efficient devices and methods of producing structures from nanoparticles without the need for recesses on the surface in which the particles collect, or for heating of the entire substrate. The present invention relates to localized laser heating of nanoparticles to produce desired structures.

BRIEF SUMMARY OF THE INVENTION

Hence, it is a general object of the invention to provide a device and method for preparing fine structures using nanoparticles that is simple and efficient.

Now, in order to implement this and still further objects of the invention, which will become more readily apparent as the description proceeds, the method for producing a structure on a substrate comprises in some embodiments the steps of depositing drops of a suspension of nanoparticles of a material in a liquid by means of a droplet generator, melting the nanoparticles of the deposited drops at least partially by exposing to laser light and solidifying the molten nanoparticles for forming the structure.

Accordingly, in some embodiments the nanoparticles are applied in drops of a suspension to the substrate using a droplet generator, which reduces the amount of suspension required. The particles are molten at least in part by exposing to laser light, whereupon they are solidified, thus forming a solid structure in those places where the nanoparticles where heated by the laser. This provides an efficient, low-loss method for forming a structure on the substrate. Compared to the method of heating the nanoparticles on the substrate in an oven or on a hotplate, laser curing leads to local heating only, so that damage to thermally sensitive regions in other areas of the substrate can be avoided. This is particularly important in the formation of conductive interconnections in integrated circuits in which thermal damage to other regions of the circuit may occur if heat applied to the nanoparticles is widely dispersed. In addition, the laser light is at least partially absorbed by the particles directly and not by the substrate, which also tends to reduce the temperature increase in the latter.

The laser light may have non-Gaussian intensity distribution for optimizing the quality of the generated structure, or it may be pulsed for improved control of the heat flow into the substrate.

In the present context, the term "Gaussian" intensity distribution is used to refer to any intensity distribution that is generated by a single Gaussian beam intersecting a plane, i.e. by a beam having an intensity proportional to $\exp(-(r/R)^2)$, where r is the distance from the beam's central axis and R is a constant. The term "non-Gaussian" intensity distribution is used to refer to any other type of intensity distribution, such as it can e.g. be generated by a beam sent through a mask or by a combination of multiple Gaussian or non-Gaussian beams.

In another aspect of the invention, the method comprises the steps of depositing drops of a suspension of nanoparticles of a material in a liquid onto said substrate, illuminating a curing point on said substrate by laser light, at least partially melting the nanoparticles of the deposited drops in said curing point and solidifying the molten nanoparticles for forming the structure.

In yet another aspect of the invention, the method comprises the steps of depositing a layer of a suspension of nanoparticles of a material in a liquid onto said substrate, illuminating a curing point on said substrate by laser light, typically having non-Gaussian intensity distribution, and at least partially melting the nanoparticles of the deposited drops in said curing point while simultaneously moving said substrate with respect to said curing point to form a line strip or other desired pattern of said material.

The average diameter of the nanoparticles should be sufficiently small for reducing the melting point of the nanoparticles substantially below the bulk melting point. For most materials the average diameter should be less than approximately 100 nm, in particular less than approximately 10 nm, preferably between approximately 1 nm and 5 nm. The nanoparticles can be of any material suited for sintering or re-melting upon laser irradiation. In particular, they can be of a metal, such as gold.

A further aspect of the invention relates to the structures produced by the methods described herein.

In a final aspect, the invention relates to a device for producing a structure on a substrate comprising a droplet generator for producing drops of a suspension of nanoparticles of a material in a liquid, said droplet generator adapted for being directed onto a substrate and a laser source with imaging means adapted for being directed to said substrate.

The substrate can be a pre-existing surface or a structure, for example a polymer structure, created by using the same printing technology as for manufacturing the nanoparticle structure and cured with a standard UV radiation or laser polymerization method, before the nanoparticle structure is deposited upon it.

BRIEF DESCRIPTION OF THE DRAWINGS

The invention will be better understood and objects other than those set forth above will become apparent when consideration is given to the following detailed description thereof. Such description makes reference to the annexed drawings, wherein.

DETAILED DESCRIPTION OF THE INVENTION

Additional descriptions of aspects of the present invention are given in Attachments A and B hereto, the entire contents of which are incorporated herein by reference and made a part hereof.

Figure 1:
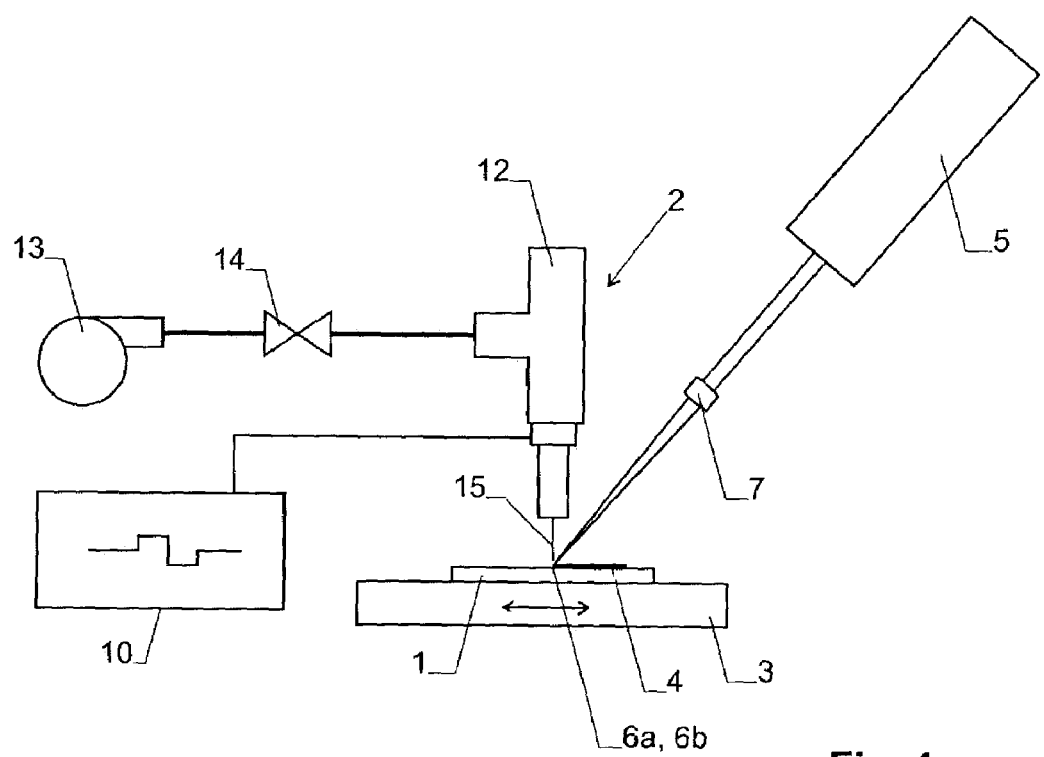
FIG. 1 is a schematic representation of a set-up for carrying out the method of some embodiments of the present invention.

FIG. 1 shows a schematic representation of an apparatus for generating a structure from nanoparticles on a substrate 1, which can e.g. be a semiconductor wafer or any other material (e.g. silicon, glass, polymer, etc.). A droplet generator 2 is provided for generating a controlled, directed series of drops of a solid in liquid suspension directed onto a drop-off point 6a on substrate 1. In one embodiment, the suspension consists of gold nanoparticles in an organic solvent.

The drops are deposited on substrate 1 to form a printed line strip 4 as a layer thereon.

The beam of a laser 5 is focussed in a curing point 6b on printed line strip 4 using suitable focusing optics 7. The radiation energy of the laser light is absorbed by the nanoparticles, leading to a temperature increase above the melting point of the particles. The generated heat evaporates the solvent and melts the nanoparticles at least partially. When the heated nanoparticles are moved away from curing point 6b, they cool down and solidify, leaving a solid structure.

While drops are being deposited and laser 5 sinters or melts the particles into the solid structure, substrate 1 is being moved with respect to laser 5 and droplet generator 2. For this purpose, substrate 1 can e.g. be displaced by a positioning stage 3, while laser 5 and droplet generator 2 remain stationary.

The position of drop-off point 6a, where drops generated by droplet generator 2 impinge on substrate 1, may coincide with position of curing point 6b, which makes it possible to create a line strip 4 along any direction. Alternatively, drop-off point 6a may be at a distance from curing point 6b, in which case substrate 1 is moved by positioning stage 3 to move the liquid suspension deposited at drop-off point 6a to the curing point 6b.

Once line strip 4 has solidified, any excess solvent and unsintered nanoparticles may be removed, if necessary, e.g. by washing. This post-processing step can be avoided by depositing a line-structure that is smaller than the curing point of the laser so that the deposit solvent is evaporated in its entirety.

A pulse generator 10 is used for generating electrical pulses which drive the operation of droplet generator 2.

In the following, some aspects of the procedure are described in more detail.

Nanoparticles, Suspension:

The nanoparticles are advantageously made of metal for forming a metallic structure, although metal compounds that deposit metal upon laser irradiation are not excluded. Gold has been found to be an especially well-suited material. As mentioned above, nanoparticles of gold show a melting point of approximately 300 to 400° C. at a diameter of 2.5 nm, which allows to form the desired structure at moderate temperatures.

A "solvent" or, more accurately, suspension-fluid advantageously employed for the nanoparticles is toluene. Toluene has good wetting properties and its viscosity is suited for generating small droplets. Further solvents include other organic solvents, such as terpineol, xylene or water.

A suspension advantageously employed in connection with some embodiments of the present is gold in toluene, with the gold particles having diameters in the range of approximately 1–5 nm, with approximately 30–35 weight percent or approximately 1.9–2.3 volume percent of gold, respectively.

The nanoparticles can also be made of a non-metallic material. In particular, the present method also allows the formation of ceramic structures of particular interest are superconducting ceramics, which can be sintered with the present process without creating the excessive thermal stress that is responsible for the brittle behavior of superconducting ceramic components.

Droplet Generator:

Droplet generator 2 can be any device suited for a controlled generation of the drops. A drop-on-demand device is advantageously employed where a volume of the suspension is compressed by piezoelectric or thermal compression, thereby generating one or more drops of the suspension through an opening onto the substrate. Piezoelectric compression or any other isothermal mechanical or electromechanical compression is advantageous because it is suited for any suspension, while the heating required in thermal compression (bubble jet method) can lead to contamination or clogging. The later can also be a viable candidate for printing if the above mentioned problems can be limited to the extent that they do not affect the process.

Droplet generator 2 comprises a reservoir 12 for receiving the suspension to be printed. When using a suspension of small viscosity and low surface tension, such as a suspension based on toluene, a vacuum pump 13 and a magnetic valve 14 can be provided for maintaining decreased pressure in the reservoir, e.g. at 10 mbar, to prevent undesired leaking.

In a some embodiments, a demand mode droplet generator used to produce micro droplets of the suspension. For example, the piezoelectric droplet generator employed is composed of a glass capillary 15 and a polarized piezoelectric crystal. The capillary is 33.6 mm long and has a nozzle with an inner diameter of 50 µm. The distance from the tip of the capillary to the substrate is 2 mm. The piezo-electric crystal has a length of 15 mm and its center is offset by 5 mm to the glass capillary. Pulse generator 10 generates bipolar pulse traces for an efficient droplet generation as described in J. F. Dijksman, 1984, "Hydrodynamics of small tubular pumps", J. Fluid Mech. vol. 139. pp. 173–191" and D. B. Bogy and F. E. Talke, 1984, "Experimental and theoretical study of wave propagation phenomena in drop-on-demand ink jet devices", IBM J. Res. Develop., vol. 28, no. 3, pp. 314–321. The contents of the aforesaid two references, Dijksman and Bogy et al, are incorporated herein by reference. Each pulse trace consists of a leading positive pulse of 40 µs at 13 V and a trailing negative pulse of 80 µs at –13 V.

A strobed light source and camera synchronized to pulse generator 10 can be used to view the generated droplets. In some embodiments, droplets of 46 µm diameter (i.e. 51 pL, picoLiter) were generated at a rate of 30 Hz.

Laser Light:

The parameters of the laser light at curing point 6b are typically selected with a view towards the properties of the nanoparticles as well as the desired heating rate and thermal distribution on the substrate. For good efficiency, at least 80% of the laser light should be absorbed in printed line strip 4.

Advantageously, the exponential absorption coefficient of the suspension for the laser light is even higher, at least 0.1 µm$^{-1}$, in particular at least 1 µm$^{-1}$, which ensures that most of the laser light is absorbed close to the surface of printed line strip 4. It has been found that the heat is transported through the whole depth of the layer, sintering or melting all nanoparticles in curing point 6b.

The wavelength of the laser light is advantageously chosen to be in a region of high absorption of the suspension. The laser can either be operated in continuous or pulsed mode.

In some embodiments, an argon ion laser operating at 488 or 514 nm was used for gold suspensions because most of the radiation at these wavelengths is absorbed in the close vicinity of the printed free surface.

The diameter of curing point 6b is advantageously sufficiently small for forming even the finest parts of the desired structure and for providing a light field with sufficient intensity. A typical diameter is less than approximately 500 µm, preferably less than approximately 100 µm. A favorable 1/e$^2$ beam waist for a Gaussian beam is 27 µm.

Typical average laser powers at a displacement speed of the order of 1 mm/s are of the order of 0.1 W to 2 W with a laser spot diameter at curing point 6b of approximately 27 µm, resulting in intensities in the order of 175 to 3500 W/mm$^2$ (50 µm 0.8–4 W; 100 µm 3.2–16 W). When a pulsed laser is used to achieve a short thermal penetration depth, the intensity of the laser should be much higher (10–1000000 times more depending on the pulse duration. Microsecond or nanosecond laser should be used).

As will be described below, non-Gaussian intensity distributions and/or multi-beam geometries are used in some embodiments. Also, as it will also be described below, pulsed laser radiation can be used to decrease thermal stress.

EXAMPLE 1

In a first example, gold nanoparticles with a mean average size of approximately 2 to 5 nm were suspended in toluene. The mass-fraction of gold in the solution was approximately 40% of the total weight.

Droplets were generated with a drop-on-demand piezoelectric jetting device as mentioned above.

The drops 3 were deposited to form printed line strip 4 on a silicon wafer substrate by moving the substrate continuously at a speed of 1 mm/s with a positioning stage. Printed line strip 4 was simultaneously cured by light from an argon ion laser at a wavelength of 488 nm, where the suspension had an absorption of less than 1 µm$^{-1}$. The curing point 6b was located right behind the point 6a where the drops impinged on the substrate 1. It had a diameter of approximately 100 µm.

After cooling, the remaining structure consisted of solid, continuous, electrically conducting gold lines with good electrical conductance. The lines had a typical width of approximately 60–100 µm.

EXAMPLE 2

In a second example, the gold in toluene suspension as mentioned under "nanoparticles, suspension" above has been used. Droplets of approximately 46 µm diameter were applied at a rate of 30 Hz to a glass substrate moving at 2 mm/s. The width of the deposited (still liquid) line was measured to be about 125 µm.

After printing, a continuous cw-Argon laser beam at 514 nm was applied for curing with the same translation speed of 2 mm/s to the center of the printed line at an angle of incidence of 45°. The laser beam had a power of 100 mW and the beam waist (1/e$^2$) was 27 µm.

Figure 2:
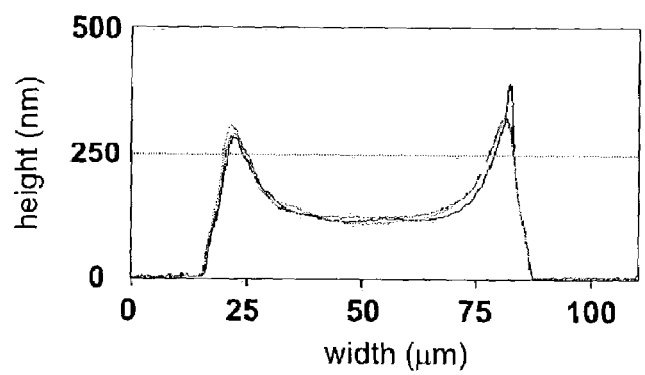
FIG. 2 shows the thickness profile of a line strip cured with a single Gaussian laser beam at 100 mW (milliWatt) and 0.2 mm/s (mm=millimeter, μm=micrometer)

Atomic force microscope (AFM) images were recorded for evaluating the cross section of the cured printed line. A thickness profile along three different lines perpendicular to the printed line are shown in FIG. 2. As can be seen, the cured line strip has a maximum thickness at its edges. The non-uniformity of the thickness is attributed to thermal diffusion of gold particles towards the edge of the beam, i.e. towards the evaporation interface line, as well as to a decreased surface tension at the center of the beam.

EXAMPLE 3

Figure 3:
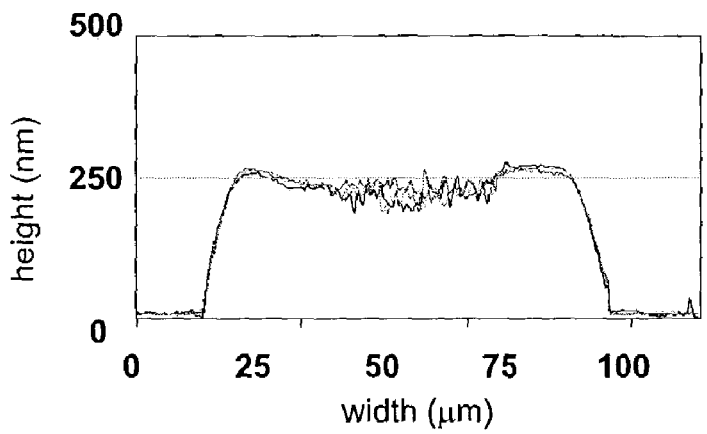
FIG. 3 shows the thickness profile of a line strip cured with a single Gaussian laser beam at 300 mW and 0.2 mm/s.

The same parameters as for example 2 were used, with the following exceptions: The translation speed was 0.2 mm/s and the laser power 300 mW. The thickness profile recorded by AFM is shown in FIG. 3.

EXAMPLE 4

Figure 4:
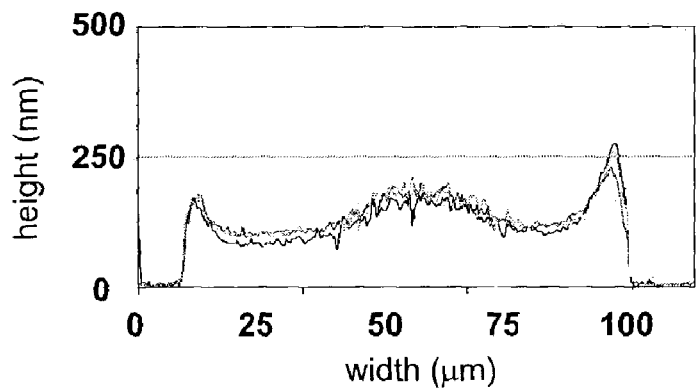
FIG. 4 shows the thickness profile of a line strip cured with a single Gaussian laser beam at 500 mW and 10 mm/s.

The same parameters as for example 2 were used, with the following exceptions: The translation speed was 10 mm/s and the laser power 500 mW. The thickness profile recorded by AFM is shown in FIG. 4.

EXAMPLE 5

In order to obtain a more homogeneous thickness over the width of the line for a wider range of illumination parameters, a method using two laser beams was applied with the same suspension and droplet generation parameters as in example 2.

Figure 5:
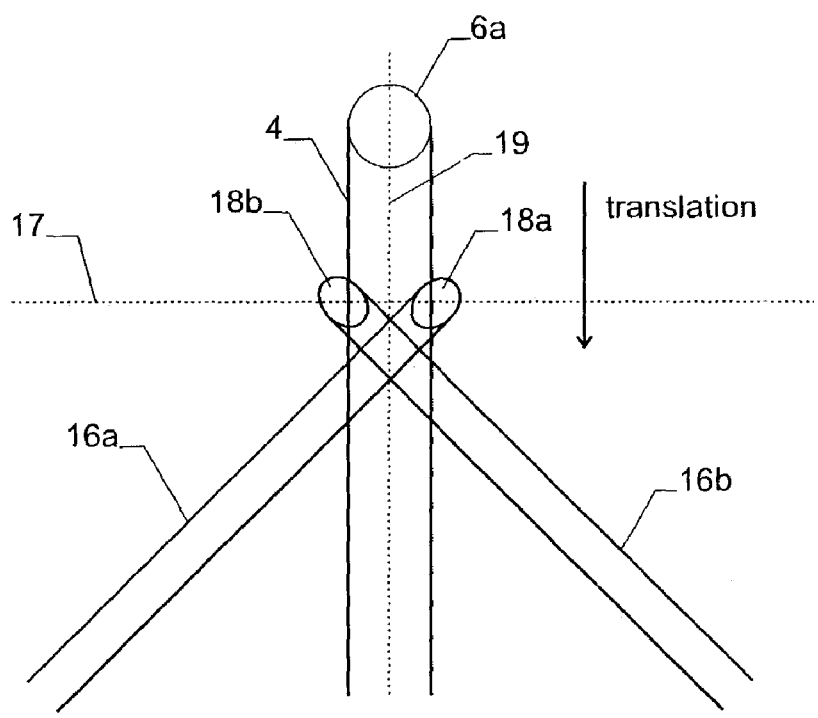
FIG. 5 shows a top view of a curing set-up advantageously employed with some embodiments of the present invention.

For this purpose, a beam splitter was used to create two laser beams 16a, 16b from an argon ion laser, which were directed by mirrors to impinge on the edges of printed line strip 4 as shown in FIG. 5. For this purpose, the laser beams 16a, 16b were brought into a common plane inclined at an angle of 45° in respect to substrate 1 and intersecting the same in a line 17 perpendicular to printed line strip 4. The angle between the laser beams 16a, 16b as seen perpendicular to substrate 1 was 90°.

The beam waist ($1/e^2$) of each laser beam 16a, 16b was 27.5 μm, the power of each laser beam was 603 mW. The distance between the centers of the spots 18a, 18b generated on substrate 1 was 140 μm, the width of the liquid printed line strip 4 was 125 μm.

Figure 6:
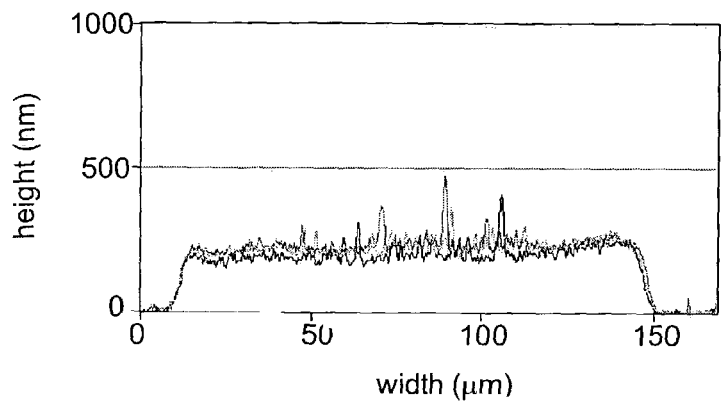
FIG. 6 shows the thickness profile of a line strip cured with double Gaussian laser beams (heart shape) at 2×603 mW and 0.5 mm/s.

FIG. 6 shows the thickness profile of the cured line strip for a translation speed of 0.5 mm/s. As it can be seen, the thickness is fairly flat over the whole strip.

Figure 7:
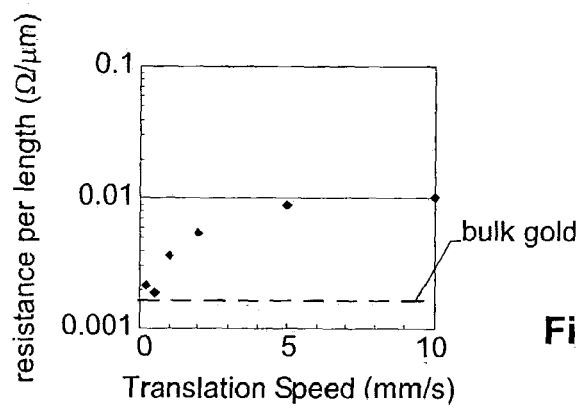
FIG. 7 shows the resistivity of a cured line strip as a function of translation speed during curing with double Gaussian laser beams (heart shape) at 2×603 mW.

It has been found that the cured line strips exhibit excellent conductivity for low translation speeds during curing, with a decrease in conductivity at increased translation speeds. As can be seen from FIG. 7, the conductivity for translation speeds below 1 mm/s is comparable to the one of bulk gold.

EXAMPLE 6

A modification of the method above can be used to manufacture polymeric structures.

Figure 9:
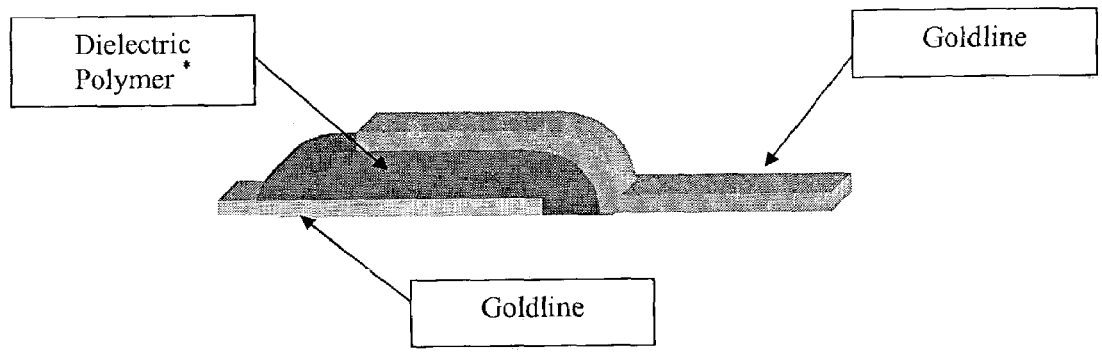
FIG. 9 is a schematic view of typical electronic components fabricated pursuant to some embodiments of the present invention.
Figure 9:
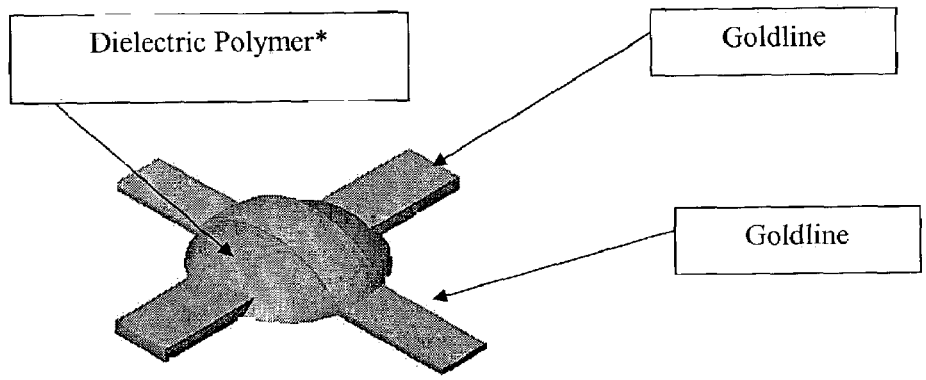

Polymer jetting combined with the printing of metallic nanoparticle suspension makes it possible to extend electric circuit printing into three dimensions. Crossings of conductors and multiple layers of conducting lines can be manufactured using similar techniques. An example of conductor crossing is depicted in FIG. 9B. An example of a capacitor fabricated with polymeric materials and conductors (typically gold) pursuant to some embodiments of the present invention is depicted in FIG. 9A. Other applications reside in fast and easy desktop production of simple electronic components. A second area of application is in wirebonding, indeed today's multiple process task of interconnecting chips can be reduced into one single machine.

In some embodiments, Norland Products Optical Adhesive NOA 73, an epoxy, was used. Other possible materials are e.g. polystyrene, poly methyl methacrylate (PMMA), polyimides and most photoresists, as well as adhesives, such as: Summers Optical# SK9, Norland Products # NOA-AY-96, Epoxy Technology # OG-125 and Epoxy Technology # OG-146.

NOA 73 was jetted onto a substrate using the droplet generator described above. In order to make NOA 73 jettable it had to be heated above approximately 45° C. Temperatures above 65° C. are to be avoided as unwanted polymerization may take place. Good results were achieved at 55° C. Droplet size and jetting frequency depend on the desired shape of the line. Typical jetting parameters of the pulse applied to the droplet generator were: rise, final rise times 10 μs, fall time 20 μs, dwell time 29 μs and echo time 58 μs, the amplitude being 20 V with an idle voltage of −15 V. The back pressure was set at 20 mbar.

The lines deposited in this manner were subsequently cured by ultraviolet light, with a maximum in the range of 350–380 nm. The recommended energy required for full curing is 4 J/cm$^2$ of long wavelength UV light, which can be achieved with irradiation from a UV lamp. UV lasers can, however, be used as well.

The technique in this example allows e.g. to deposit a structured polymer layer above or below a structure of sintered nanoparticles by depositing drops of a polymerizable liquid on the substrate or on the next lower structure, respectively, and polymerizing the drops of deposited polymerizable liquid, e.g. using UV radiation.

Polymer jet-deposition may not, in all cases, deposit the polymer in precisely the desired shape or thickness. For example, electrical properties, such as capacitance or resistance, may need to be adjusted following deposition of the polymer. In addition, the upper surface of the deposited polymer may have an irregular shape, difficult to coat with continuous layers of electrical conductor. Some embodiments of the present invention include secondary laser processing of the polymer to improve its performance and/or properties. For example, a $CO_2$ laser or a UV-laser can be employed to impinge on the polymer to alter its electrical properties, smooth or planarize its surface, and/or change its shape or thickness. Laser impact may remove polymeric material in desired locations to smooth the surface for advantageous deposition of gold lines and/or change the electrical characteristics. However, laser impact may cause the polymeric material to flow into a different geometry without material removal.

In addition, laser impact may cause chemical, structural and/or morphological changes of the polymer, any or any combination of which can alter the electrical or surface properties of the polymer. For example, a uv-curable polymer can be spin-coated on a substrate and selectively cured by a uv laser. Subsequent removal of the uncured portion leads to polymeric material on the substrate only where desired.

Secondary laser processing (if used) can conveniently be performed by an laser beam integrated with the particle deposition system. Such secondary laser processing can be carried out substantially concurrently with particle deposition, or very soon following deposition, as well as after formation of the structure on the substrate. In addition, the laser beam may have a tailored shape to facilitate reflow, material removal or other polymer reshaping for desirable physical, electrical or chemical properties.

CONCLUSIONS, FURTHER EMBODIMENTS

The above examples show that the morphology and quality of the cured line is influenced by the spatial intensity distribution of the curing laser. In particular, it has been found that using specially tailored, laser intensity profile, typically having at least two spatially separated intensity maxima, can be advantageous. In example 5, such a distribution was generated with two separate laser beams impinging on substrate 1 at opposite sides of and symmetrical to a center line 19 of line strip 4. In general, using a light intensity distribution that has a local minimum on center line 19 is advantageous for a line strip having a flat thickness profile.

The arrangement of FIG. 5 is only one of several possibilities for generating such an intensity distribution. In particular, the two laser beams may also be non-intersecting and/or parallel. Alternatively, a single laser beam could be used with a suitable non-Gaussian intensity distribution, which can e.g. be generated using a suitable mask, diffractive optics, phase-shift mask and/or using a higher mode of the laser instead of a Gaussian TEM-00 mode.

Furthermore, more than two laser beams can be used, e.g. two on each side of center line 19.

It is noted that the morphology of deposited gold is closely related to the evaporation of the carrier solvent and the electrical resistance is related to the maximum temperature experienced by the nanoparticle (i.e. the extent of melting of nanoparticles). Therefore, two lasers can be applied to control the evaporation (i.e. morphology) and the melting, respectively.

In the above examples, a cw-laser with a continuous laser beam has been used. Alternatively, a pulsed laser can be employed or the continuous laser can be temporally modulated. The application of repetitively pulsed curing light with pulses in the millisecond, microsecond, picosecond or even femtosecond range has the advantage that higher peak powers can generate higher peak temperatures at the point of impact without additionally heating the bulk of substrate 1.

The temperature field in substrate 1 depends on the laser pulse duration. The thermal penetration depth scales as $$\sqrt{\alpha t_{pulse}},$$

where $\alpha$ is the thermal diffusivity of the material and $t_{pulse}$ the laser pulse duration. For typical thermal diffusivity of glass at $10^{-6}$ m$^2$/s, the thermal penetration depth is of the order of 10 microns for laser pulse duration of 100 microseconds. For polymers, the depth is somewhat shallower for the same pulse duration due to lower thermal diffusivity. On the other hand, the maximum temperature at the surface of the material at the end of the laser pulse is proportional to $$1/k \cdot \sqrt{\alpha/t_{pulse}},$$

where k is the thermal conductivity of the material. Hence, both the thermal penetration-depth and the maximum temperature rise can be controlled by adjusting the laser pulse duration. The thermal penetration depth defines the heat-affected-zone, i.e. the region that is subjected to temperature gradients and thus to thermal stress. In the case of glass and polymer materials, we keep in mind that the material volume subjected to temperatures above the glass transition temperature may be subjected to permanent deformation. In addition, the applied cooling rate is also important in permanent deformation.

Further improvement of the process can be accomplished by superposing tailored trains of pulses of different pulse durations and waiting periods between the pulses. This can be easily done using acousto-optical modulators, etc. In addition, even different lasers can be used in tandem. For example, a millisecond laser can be used to raise the temperature field to a preheat temperature distribution synchronized with the following laser pulse and the laser pulse can then drive the peak temperature to the desired level for sintering. The curing process that happens by heat diffusion across the sintered gold film ahead of the laser beam can thus be sustained without overheating and damaging the substrate.

When building multi-layer structures, electrically insulating materials also act as thermal barriers to heat transfer. By controlling the temporal dependence of the laser pulse, thermal damage to buried sensitive parts can be reduced without packing excessive insulator.

Techniques for generating pulsed laser pulses, e.g. with modulators outside or within the laser's cavity, are known to the person skilled in the art.

For expediting the melting or sintering of the nanoparticles, the substrate and/or the suspension can be heated to a temperature below the melting point of the nanoparticles by a means separate from the laser light, e.g. a resistive heating element below the substrate, thereby decreasing the amount of energy required from the laser. In particular, the substrate temperature may be sufficiently high to cause at least partial evaporation of the "solvent" before the nanoparticles are brought into contact with the laser light at curing point 6b of the laser beams. In this case, the power provided by the laser can be lower because no laser energy is required for removing the solvent.

As mentioned above, laser curing can take place during or after deposition of the drops on the substrate. In addition, laser light can be used to locally heat the substrate before the deposition of the drops on the substrate, thereby expediting or achieving evaporation solvent and, if desired, also sintering of the particles.

Instead of being present in the form of a regular suspension (i.e. a solid in liquid suspension), layer 4, may also be formed by a "solid suspension", i.e., the nanoparticles can be suspended in a solid matrix, e.g. by solidifying the "solvent" after printing by temperature decrease or partial evaporation. Alternatively, the nanoparticles can be suspended in a gas.

Figure 8:
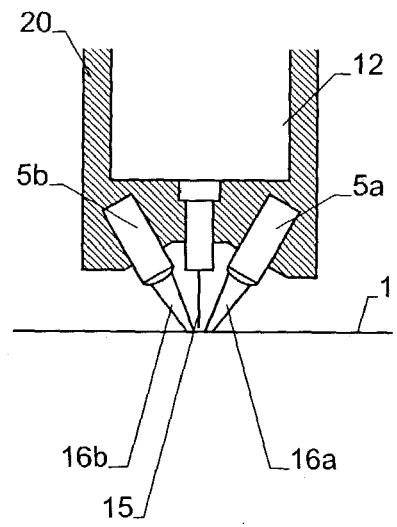
FIG. 8 is partially sectional view of a printing head with integrated curing light sources.

A very rugged device is obtained when the emitter or emitters for the curing light are integrated with droplet generator 2 into a single printing head. For example, as shown in FIG. 8, one or more laser diodes 5a, 5b may be integrated in a head 20 together with the droplet generator. The light beams 16a, 16b from the diodes 5a, 5b is e.g. focussed on the spot where the droplets impinge on the substrate. Alternatively, only part of the light source, such as optical fibers and micro-optical components connected to an external laser, may be integrated in the printing head. This approach will ensure precise delivery of the laser beam onto the deposited slurry droplet, thereby maintaining the focal depth, beam size and positioning. Arrays of multiple units of nozzle/fiber coupled laser beams will speedup the process throughput.

In the above examples, the suspension layer or line strip 4 has been formed by applying drops generated by droplet generator 2 to substrate 1. Instead of a drop-wise application of the suspension, other coating methods, such as spin coating, can be used for producing layer 4. Again, the laser light is then used for forming the desired structure.

Besides substrates of silicon or glass, other types of substrates can be used as well, such as substrates of ceramics or plastics. The present method is especially suited for being used with a substrate 1 of a material that is transparent for the laser light, i.e. that has an absorption that is much lower than the one of the nanoparticles, such as glass or a suitable polymer, because a transparent substrate will not be subject to significant undesired heating by the laser light. When using a transparent substrate, the laser light can also be sent from below through the substrate to curing point 6b.

Various substrates, including flexible materials, polymers, ceramics and plastics are compatible with the present technique. In addition to metal (gold, silver, etc.) nanoparticles, the method can also be applied to semiconductor, superconductor and ceramic nanoparticles. Furthermore, the deposition of functional materials can alternate with the deposition of polymers for the fabrication of 3-D conductor patterns.

The advantages compared to current manufacturing methods of printed wiring or circuit boards are many-fold. The present methods save expensive materials by only depositing material at desired places on the substrate and then fully utilizing the entire nanoparticle material. The novel process presented herein is straightforward and fast. The desired pattern can be designed with appropriate CAD/CNC software. Taking advantage of the unique property of gold ultra fine particles (UFPs) to melt and bond at low temperatures makes the printing of gold microline interconnections possible via on-demand microdroplet generation where one deals with a room temperature nanosuspension rather than molten gold at a temperature exceeding 1100 deg. C (melting point 1063° deg). Furthermore, excess thermal stresses and possible melting or even burning of sensitive chip structures can be avoided. The method is expected to be applicable in a normal atmospheric environment yielding a fast, user-friendly and cost-effective interconnection manufacturing process appropriate for use in combination with a variety of delicate substrate materials.

In contrast to a global heating of the substrate, heating by means of laser light further allows one to define the geometry of the cured material and its electrical properties as shown above, and it keeps the global temperature increase within the substrate small.

The method described here can be used for forming virtually any type of structure. Examples are conducting lines for interconnections on or to a semiconductor chip or for connecting a semiconductor chip to a substrate or to connector pins, metallic or non-metallic parts of Micro Electromechanical Systems (MEMS) or superconducting structures.

Resistors can be made by varying the line width, lines with a larger cross-section having lower resistance. Another way to influence the resistance of a conductor part is by changing the curing parameters. Nanoparticle suspension lines that have been cured to a higher degree (using for example the double laser scheme) show a resistance which is closer to the one of bulk gold.

By coordinating laser heating and substrate movement, curved patterns can be generated. Single or multiple printing and laser passes can be carried out on the same substrate using the same of different nanoparticle materials.

The concentration of the nanoparticles, substrate velocity, illumination intensity, droplet diameter and rate, and pre-impact droplet temperature are parameters that can be optimized according to the specific needs of an application.

A primary application of the present invention is the construction of gold lines for interconnections in electronics manufacturing, ranging from chip assembly packaging to flat panel display construction. The critical benefit to be harvested from the low melting and bonding temperatures of the gold nanoparticles is twofold: First, the printing of gold microline interconnections with an on-demand microdroplet generation technique is possible because one deals with a room temperature nanosuspension facilitating the application of piezoelectric ceramics with Curie temperatures of only a few hundred degrees Celsius. This would be impossible with molten gold at temperatures exceeding 1063° C. Second, at the droplet deposition end, excess thermal stress and melting or burning of sensitive chip structures can be avoided. The method can be used under normal atmosphere environment yielding a fast, user friendly and cost effective interconnection manufacturing process appropriate for use in combination with a variety of delicate substrate materials.

While there are shown and described presently preferred embodiments of the invention, those skilled in the art can readily devise many other varied embodiments that still incorporate these teachings.

The invention claimed is:

1. A method fo producing a structure on a substrate comprising the steps of
   a) depositing drops of a suspension onto a substrate, wherein in said suspension comprise nanoparticles of a material suspended in a liquid; and,
      wherein said a substrate lacks recesses in the region where said drops are deposited onto said substrate; and,
   b) exposing said nanoparticles an said substrate to at least one localized spot of laser light such that said nanoparticles are at least partially melted by said at least one localized spot of laser light; and,
   c) solidifying said at least partially melted nanoparticles, forming thereby said structure on said substrate.

2. The method of claim 1, further comprising the steps of directing said at least one localized spot of laser light to at least one curing point on said substrate and translating said at least one curing point over said substrate.

3. The method of claim 1 further comprising the steps of depositing said drops at a drop-off point on said substrate and translating said drop-off point with respect to said substrate.

4. The method of claim 1 further comprising the steps of directing said at least one localized spot of laser light to a curing point on said substrate, depositing said drops at a drop-off point on said substrate, and translating said curing point and said drop-off point over said substrate.

5. The method of claim 4 wherein said curing point and said drop-off point coincide.

6. The method of claim 4 wherein said curing point and said drop-off point are located at a distance from each other.

7. The method of claim 1 further comprising the step of generating said drops by compressing a volume of said suspension and thereby squirting said drops through an opening onto said substrate.

8. The method of claim 1 wherein said liquid is selected from the group consisting of toluene, terpineol, xylene, water and mixtures thereof.

9. The method of claim 1 wherein the exponential absorption coefficient of said at least one localized spot of laser light in said suspension is at least approximately $0.1\ \mu m^{-1}$.

10. The method of claim 1 wherein said suspension is deposited as a layer on said substrate and wherein at least 80% of said at least one localized spot of laser light is absorbed in said layer.

11. The method of claim 1 wherein said nanoparticles comprise at least one metal.

12. The method of claim 1 wherein said liquid comprises toluene and said nanoparticles comprise gold.

13. The method of claim 1 wherein the size of said nanoparticles is sufficiently small that the melting point of said nanoparticles is substantially below the melting point of the bulk material comprising said nanoparticles.

14. The method of claim 1 wherein an average diameter of said nanoparticles is less than approximately 100 nm.

15. The method of claim 1 wherein said structure is a superconductor.

16. The method of claim 2 wherein an intensity distribution of one or more of said at least one localized spot of laser light at said curing point is non-Gaussian.

17. The method of claim 2 wherein an intensity distribution of one or more of said at least one localized spot of laser light at said curing point has at least two spatially separated maxima.

18. The method of claim 2 wherein said drops are deposited along a line strip on said substrate, wherein an intensity distribution of said at least one localized spot of laser light at said curing point-has a local minimum on a center line of said line strip.

19. The method of claim 2 wherein said drops are deposited along a line strip on said substrate, wherein said exposing of said nanoparticles comprises
   directing at least two laser beams onto said substrate at said curing point, such that said laser beams impinge on opposite sides of a center line of said line strip.

20. The method of claim 1 wherein said at least one localized spot of laser light is pulsed.

21. The method of claim 1 further comprising immediately following step (a), the step of
   a₁) evaporating at least part of cold liquid.

22. The method of claim 1 further comprising the step of heating said substrate by a means separate from said laser light.

23. The method of claim 1 wherein said substrate is transparent to said laser light.

24. The method of claim 1 further comprising the step of generating, above or below said structure, a ploymer layer by
   depositing drops of a polymerizable liquid, and
   polymerizing said drops of deposited polymerizable liquid.

25. The method of claim 24, wherein said drops of deposited polymerizable liquid are polymerized using UV radiation.

26. The method of claim 9 wherein said exponential absorption coefficient of said at least one localized spot of laser light in said suspension is at least approximately 1 $\mu m^{-1}$.

27. The method of claim 14 wherein said average diameter of said nanoparticles is less than approximately 10 nm.

28. The method of claim 27 wherein said average diameter of said nanoparticles in the range from approximately 1 nm to approximately 5 nm.

29. A method for making a capacitor comprising:
   a) depositing a first electrically conductive structure on an insulating substrate comprising the steps of;
   a1) depositing drops of a first suspension onto said insulating substrate,
      wherein said first suspension comprises nanoparticles of a material suspended in a liquid; and,
      wherein said insulating substrate lacks recesses in the region where said drops are deposited onto said insulating substrate; and,
   a2) exposing said nanoparticles on said insulating substrate to at least one localized spot of laser light such that said nanoparticles are at least partially melted by said at least one localized spot of laser light; and,
   a3) solidifying said at least partially melted nanoparticles, forming thereby said first electrically conductive structure on said insulating substrate; and,
   b) depositing a dielectric structure on said first electrically conductive structure, comprising the steps of;
   b1) depositing drops of a polymerizable liquid on said first electrically conductive structure; and,
   b2) polymerizing said drops of said polymerizable liquid, forming thereby a dielectric structure on said first electrically conductive structure; and,
   c) depositing a second electrically conductive structure on said dielectric structure, comprising the steps of;
   c1) depositing drops of a second suspension onto said dielectric structure,
      wherein said second suspension comprises nanoparticles of a material suspended in a liquid; and,
   c2) exposing said nanoparticles on said dielectric structure to at least one localized spot of laser light such that said nanoparticles are at least partially melted by said at least one localized spot of laser light; and,
   c3) solidifying said at least partially melted nanoparticles, forming thereby said second electrically conductive structure on said dielectric structure; such that said first electrically conductive structure and said second electrically conductive structure surround said dielectric structure forming thereby a capacitor.

30. A method for crossing a first electrical conductor and a second electrical conductor on an insulating substrate while maintaining electrical isolation between said first and second electrical conductors, comprising:
   a) depositing a first electrically conductive structure on an insulating substrate comprising the steps of;
   a1) depositing drops of a first suspension onto said insulating substrate,
      wherein said first suspension comprises nanoparticles of a material suspended in a liquid; and, wherein said insulating substrate lacks recesses in the region where said drops are deposited onto said insulating substrate; and,
   a2) exposing said nanoparticles on said insulating substrate to at least one localized spot of laser light such that said nanoparticles are at least partially melted by said at least one localized spot of laser light; and,
   a3) solidifying said at least partially melted nanoparticles, forming thereby said first electrically conductive structure on said insulating substrate; and,
   b) depositing an insulating structure on said first electrically conductive structure, comprising the steps of;
   b1) depositing drops of a polymerizable liquid on said first electrically conductive structure; and,
   b2) polymerizing said drops of said polymerizable liquid, forming thereby an insulating structure on said first electrically conductive structure; and,
   c) depositing a second electrically conductive structure on said insulating structure, comprising the steps of;
   c1) depositing drops of a second suspension onto said insulating structure,
      wherein said second suspension compnses nanoparticles of a material suspended in a liquid; and,
   c2) exposing said nanoparticles on said insulating structure to at least one localized spot of laser light such that said nanoparticles are at least partially melted by said at least one localized spot of laser light; and,
   c3) solidifying said at least partially melted nanoparticles, forming thereby said second electrically conductive structure on said insulating structure; such that said first electrically conductive structure and said second electrically conductive structure are separated by said insulating structure and maintain electrical isolation thereby.

* * * * *

UNITED STATES PATENT AND TRADEMARK OFFICE
CERTIFICATE OF CORRECTION

PATENT NO. : 7,087,523 B2  Page 1 of 1
APPLICATION NO. : 10/621046
DATED : August 8, 2006
INVENTOR(S) : Constantine P. Grigoropoulos et al.

It is certified that error appears in the above-identified patent and that said Letters Patent is hereby corrected as shown below:

Item (73) on the front page of the patent    insert after the current assignee, the following second assignee:
--Eidgenössische Technische Hochschule Zürich, Zürich, Switzerland--

Signed and Sealed this

Twenty-first Day of November, 2006

JON W. DUDAS
*Director of the United States Patent and Trademark Office*